United States Patent
Chou et al.

(10) Patent No.: US 11,823,770 B1
(45) Date of Patent: Nov. 21, 2023

(54) MEMORY SYSTEM AND MEMORY ACCESS INTERFACE DEVICE THEREOF

(71) Applicant: REALTEK SEMICONDUCTOR CORPORATION, Hsinchu (TW)

(72) Inventors: Ger-Chih Chou, San Jose, CA (US); Chih-Wei Chang, Hsinchu (TW); Li-Jun Gu, Suzhou (CN); Chun-Chi Yu, Hsinchu (TW); Fu-Chin Tsai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 93 days.

(21) Appl. No.: 17/735,142

(22) Filed: May 3, 2022

(51) Int. Cl.
G11C 7/22 (2006.01)
G11C 8/18 (2006.01)
G11C 7/10 (2006.01)

(52) U.S. Cl.
CPC ............ G11C 7/222 (2013.01); G11C 7/1066 (2013.01); G11C 7/1093 (2013.01); G11C 8/18 (2013.01)

(58) Field of Classification Search
CPC .................................. G11C 7/222; G11C 7/22
USPC ...................................................... 365/233.1
See application file for complete search history.

(56) References Cited

U.S. PATENT DOCUMENTS

| | | | | |
|---|---|---|---|---|
| 7,107,424 B1 * | 9/2006 | Avakian | ............ | G06F 13/4243 |
| | | | | 713/400 |
| 8,976,596 B1 * | 3/2015 | Yamamoto | ............ | G11C 16/32 |
| | | | | 365/185.24 |
| 11,004,385 B1 * | 5/2021 | Li | ........................ | G09G 3/3233 |
| 2002/0087768 A1 * | 7/2002 | Srikanth | ............... | G11C 7/1093 |
| | | | | 710/118 |
| 2012/0170389 A1 * | 7/2012 | Kizer | .................. | G11C 11/4072 |
| | | | | 365/193 |
| 2018/0018092 A1 * | 1/2018 | Chae | .................... | G11C 29/023 |
| 2019/0206478 A1 | 7/2019 | Jun | | |
| 2020/0280467 A1 | 9/2020 | Taylor | | |

FOREIGN PATENT DOCUMENTS

CN 109976665 A 7/2019

OTHER PUBLICATIONS

OA letter of a counterpart TW application (appl. No. 111118374) mailed on Mar. 7, 2023. Summary of the TW OA letter: Claims 1 and 10 lack of descriptions of connection among elements therein. Claims 4, 6 and 8 include terms that lack of antecedent basis. Claims 6 includes a description of "P" that is indefinite.

* cited by examiner

Primary Examiner — Muna A Techane
(74) Attorney, Agent, or Firm — WPAT, PC

(57) ABSTRACT

The present disclosure discloses a memory access interface device. A data processing circuit receives a data signal including 2M pieces of data from a memory device. A sampling clock generation circuit receives a data strobe signal from the memory device to generate a valid data strobe signal having P valid strobe pulses and further generate a sampling clock signal accordingly, in which P is larger than M. A sampling circuit samples the data signal according to the sampling clock signal to generate sampling results. A control circuit determines valid sampling results according to a time difference between the valid data strobe signal and the data signal and outputs valid data generated according to the valid sampling results as a read data signal to a memory access controller.

20 Claims, 4 Drawing Sheets

MEMORY SYSTEM AND MEMORY ACCESS INTERFACE DEVICE THEREOF

BACKGROUND OF THE INVENTION

1. Field of the Invention

The present disclosure relates to a memory system and a memory access interface device thereof.

2. Description of Related Art

Double data rate (DDR) memories quickly become the mainstream of memory devices due to the advantage of speed. The memory technology has progressed to high speed configurations such as DDR5 and LPDDR5 (Low power DDR5), which support the speed at least up to DDR-3200 (having the clock frequency of 1600 MHz), and even up to DDR-6400 (having the clock frequency of 3200 MHz).

However, the conventional memory data reading technology cannot be applied to the memories having such a high transmission speed. The skew between the data signal and the data strobe signal cannot be shrunk due to the extremely high clock frequency such that the timing of the data strobe signal may become too much behind the timing of the data signal, and therefore the data strobe signal cannot be used to sample the data signal accurately. As a result, a data reading technology that can satisfy the requirements of both the high speed memory devices and low speed memory devices is in demand.

SUMMARY OF THE INVENTION

In consideration of the problem of the prior art, an object of the present disclosure is to provide a memory system and a memory access interface device thereof.

The present disclosure discloses a memory access interface device that includes a data processing circuit, a sampling clock generation circuit, a sampling circuit and a control circuit. The data processing circuit is configured to receive and process a data signal comprising a plurality of pieces of data from a memory device, wherein a data amount of the data is 2M, M being a positive integer. The sampling clock generation circuit is configured to receive and process a data strobe signal from the memory device to generate a valid data strobe signal having a plurality of valid strobe pulses and further generate a plurality of sampling clock signals having an amount of 2N, wherein a valid strobe pulses amount of the valid strobe pulses is P, P being larger than M and each of N and P being a positive integer. The sampling circuit is configured to sample the data signal according to the sampling clock signals to generate a plurality of sampling results. The control circuit is configured to set a first part of the sampling results corresponding to the data signal as a plurality of valid sampling results according to a time difference between the valid data strobe signal and the data signal. The control circuit is further configured to output a plurality of pieces of valid data generated based on the valid sampling results as a read data signal to a memory access controller.

The present disclosure also discloses a memory system that includes a memory access controller, a memory device and a memory access interface device. The memory access interface device includes a data processing circuit, a sampling clock generation circuit, a sampling circuit and a control circuit. The data processing circuit is configured to receive and process a data signal comprising a plurality of pieces of data from the memory device, wherein a data amount of the data is 2M, M being a positive integer. The sampling clock generation circuit is configured to receive and process a data strobe signal from the memory device to generate a valid data strobe signal having a plurality of valid strobe pulses and further generate a plurality of sampling clock signals having an amount of 2N, wherein a valid strobe pulses amount of the valid strobe pulses is P, P being larger than M and each of N and P being a positive integer. The sampling circuit is configured to sample the data signal according to the sampling clock signals to generate a plurality of sampling results. The control circuit is configured to set a first part of the sampling results corresponding to the data signal as a plurality of valid sampling results according to a time difference between the valid data strobe signal and the data signal. The control circuit is further configured to output a plurality of pieces of valid data generated based on the valid sampling results as a read data signal to the memory access controller.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a memory system and a memory access interface device thereof to increase a sampling range by setting the valid strobe pulses amount of the valid data strobe signal larger than the data amount of the data signal, so as to avoid the false memory read results generated due to the time difference between the data signal and the data strobe signal.

Figure 1:
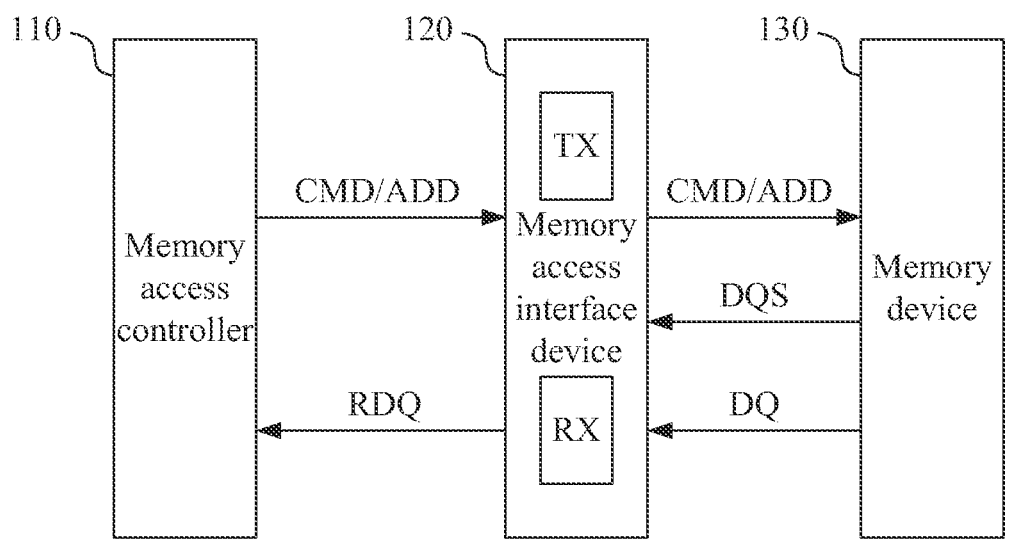
FIG. 1 illustrates a block diagram of a memory system according to an embodiment of the present invention.

Reference is now made to FIG. 1. FIG. 1 illustrates a block diagram of a memory system 100 according to an embodiment of the present invention. The memory system 100 includes a memory access controller 110, a memory access interface device 120 and a memory device 130.

The memory system 100 can be electrically coupled to other modules through such as, but not limited to a system bus (not illustrated). For example, the memory system 100 can be electrically coupled to a processor (not illustrated) through a system bus such that the processor can access the memory system 100.

In an embodiment, the memory access interface device 120 can be such as, but not limited to a physical layer circuit.

Preferably, the memory device 130 is a memory that supports double data transmission rate mode, e.g., the memory devices of DDR4, LPDDR4, DDR5 and LPDDR5.

External access signals, e.g. the access signals from the processor, can be received by the memory access controller 110 first and can be transmitted to the memory access interface device 120. Further, the access signals can be either transmitted from the memory access interface device 120 to the memory device 130 or used as a reference signal within the memory access interface device 120 to access the memory device 130.

For example, the memory access controller 110 can receive and transmit the access signals including such as, but not limited to a command signal CMD and an address signal ADD.

According to the signals described above, the memory access interface device 120 can transmit the access signals, e.g., the command signal CMD and the address signal ADD, to activate the memory device 130. The memory access interface device 120 further receives the data signal DQ from the activated the memory device 130 and samples the data signal DQ to generate and transmit a read data signal RDQ to the memory access controller 110.

As a result, the internal data of the memory device 130 can thus be accessed according to the correct timing of the signals described above.

The memory access interface device 120 substantially includes a receiver RX and a transmitter TX. The configuration and the operation of the transmitter RX are described in detail in the following paragraphs.

Figure 2:
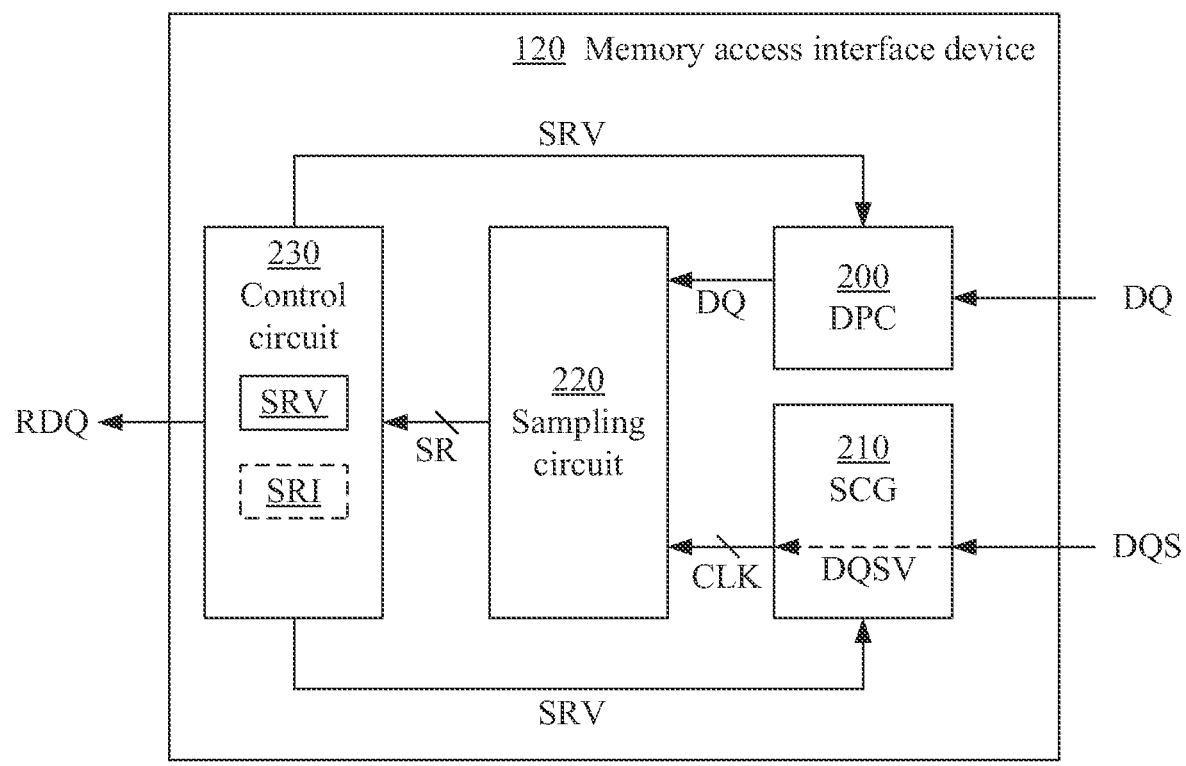
FIG. 2 illustrates a detailed block diagram of the memory access interface device in FIG. 1 according to an embodiment of the present invention.
Figure 3:
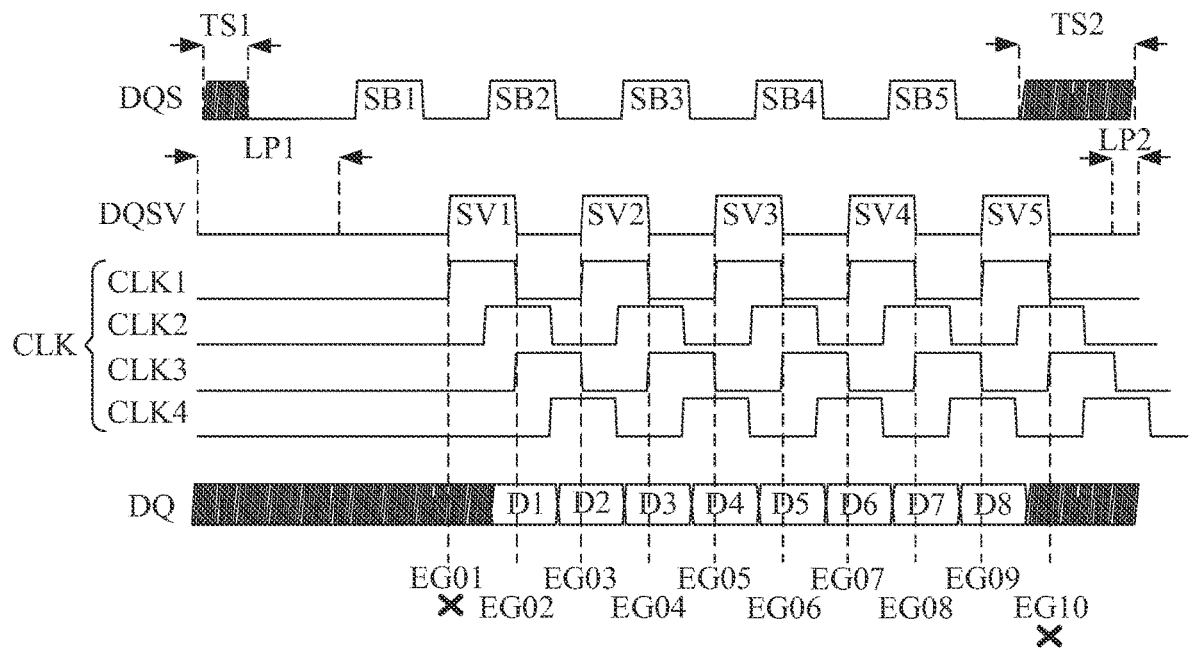
FIG. 3 illustrates a timing diagram of the signals related to the read operation of the memory access interface device according to an embodiment of the present invention.

Reference is now made to FIG. 2 and FIG. 3 at the same time. FIG. 2 illustrates a detailed block diagram of the memory access interface device 120 in FIG. 1 according to an embodiment of the present invention. It is appreciated that only the receiver RX of the memory access interface device 120 is illustrated in FIG. 2 without illustrating the transmitter TX. FIG. 3 illustrates a timing diagram of the signals related to the read operation of the memory access interface device 120 according to an embodiment of the present invention.

The memory access interface device 120 includes a data processing circuit 200 (abbreviated as DPC in FIG. 2), a sampling clock generation circuit 210 (abbreviated as SCG in FIG. 2), a sampling circuit 220 and a control circuit 230.

The data processing circuit 200 is configured to receive and process the data signal DQ including a plurality of pieces of data from the memory device 120.

In an embodiment, the data processing circuit 200 is a decision feedback equalizer (DFE) to fine tune the data signal DQ, e.g., adjusting the gain and the phase of the data signal DQ, according to information fed back from the control circuit 230 to reduce the overshoot and undershoot and expand the eye of the signal.

The data amount of the data included in the data signal DQ is 2M, M being a positive integer. As illustrated in FIG. 3, the data signal DQ includes 8 pieces of data D1~D8. Under such a condition, M is 4.

The sampling clock generation circuit 210 is configured to receive and process the data strobe signal DQS from the memory device 130 to generate a valid data strobe signal DQSV having a plurality of valid strobe pulses and further generate a plurality of sampling clock signals CLK having an amount of 2N, wherein a valid strobe pulses amount of the valid strobe pulses is P, P being larger than M and each of N and P being a positive integer.

The operation of the sampling clock generation circuit 210 is described in detail with a plurality of stages.

At first, the sampling clock generation circuit 210 receives the data strobe signal DQS from the memory device 130.

In an embodiment, the memory device 130 is a LPDDR4 memory device that supports an additional strobe function. Under such a condition, the data strobe signal DQ that the sampling clock generation circuit 210 receives has a plurality of strobe pulses. The data strobe signal DQ further has a tri-state preamble section ahead of the strobe pulses and has a tri-state postamble section behind the strobe pulses. A strobe pulses amount of the strobe pulses is P and a timing of the strobe pulses is ahead of the data, P being equal to M+A and A being a positive integer larger than or equal to 1.

In some approaches, the strobe pulses amount of the data strobe signal DQS is the same as the data amount of the data signal DQ. However, a time difference exists between the data signal DQ and the data strobe signal DQS due to the manufacturing process. The high-speed LPDDR4 memory device has a short clock period (due to having a higher frequency) such that the timing of the sampling clock signals is easy to fall behind the timing of the data signal DQ for over 0.5 clock period. The data may thus be falsely sampled.

Since the LPDDR4 memory device supports the additional strobe function, the memory device 130 may generate additional strobe pulses such that the strobe pulses amount is more than the data amount under the activation of such as, but not limited to the memory access interface device 120. The timing of the strobe pulses is ahead of the timing of the data of the data signal DQ.

As illustrated in FIG. 3, in the present embodiment, the data strobe signal DQS has 5 strobe pulses SB1~SB5. The timing of the strobe pulses SB1~SB5 is ahead of the timing of the data signal DQ. Under such a condition, P is 5 and A is 1. Further, the data strobe signal DQS has a tri-state preamble section TS1 ahead of the strobe pulses SB1~SB5 and has a tri-state postamble section TS2 behind the strobe pulses SB1~SB5.

Further, the sampling clock generation circuit 210 processes the data strobe signal DQS to generate the valid data strobe signal DQSV having a plurality of valid strobe pulses, wherein a valid strobe pulses amount of the valid strobe pulses is P. Since P is M+A and A is a positive integer, P is larger than M.

More specifically, the sampling clock generation circuit 210 eliminates the tri-state preamble section TS1 of the data strobe signal DQS to generate a low state preamble section LP1, and eliminates the tri-state postamble section TS2 of the data strobe signal DQS to generate a low state postamble section LP2, so as to generate the valid data strobe signal DQSV. In an embodiment, the sampling clock generation circuit 210 may perform logic operation by using internal logic circuits to eliminate the tri-state and generate the low state.

As illustrated in FIG. 3, in the present embodiment, the valid data strobe signal DQSV includes 5 valid strobe pulses SV1~SV5. The valid strobe pulses SV1~SV5 have edges EG01~EG10 (including rising edges and falling edges). The valid data strobe signal DQSV further has a low state preamble section LP1 ahead of the valid strobe pulses SV1~SV5 and has a low state postamble section LP2 behind the valid strobe pulses SV1~SV5. However, since the valid data strobe signal DQSV is generated according to the processing of the sampling clock generation circuit 210, the timing of the valid data strobe signal DQSV is behind the timing of the data strobe signal DQS.

Further, the sampling clock generation circuit 210 generates a plurality of sampling clock signals CLK having an amount of 2N according to the valid data strobe signal DQSV. N is a positive integer.

As illustrated in FIG. 3, in the present embodiment, the sampling clock signals CLK actually have 4 sampling clock signals CLK1~CLK4, wherein each of the neighboring two of the sampling clock signals has a phase difference of 90 degrees therebetween. Under such a condition, N is 4.

In an embodiment, the sampling clock generation circuit 210 can also fine tune the data strobe signal DQS according to information fed back from the control circuit 230, to adjust the timing of the sampling clock signals CLK.

The sampling circuit 220 is configured to sample the processed data signal DQ according to the sampling clock signals CLK to generate a plurality of sampling results SR. Due to the double data rate, the sampling circuit 220 performs sampling according to the rising edges and the falling edges of the sampling clock signals CLK1~CLK4. As a result, corresponding to the edges EG01~EG10 that each of the valid strobe pulses SV1~SV5 has, the sampling circuit 220 generates 4 sampling results. Two of the sampling results serve as the data, and the other two of the sampling results serve as edge information.

The control circuit 230 is configured to set a first part of the sampling results SR corresponding to the data signal DQ as a plurality of valid sampling results SRV according to a time difference between the valid data strobe signal DQSV and the data signal DQ. The control circuit 230 is also configured to set a second part of the sampling results SR not corresponding to the data signal DQ as a plurality of invalid sampling results SRI. In an embodiment, the time difference between the valid data strobe signal DQSV and the data signal DQ can be measured in advance, so as to obtain the timing relation between the edges EG01~EG10 of the valid data strobe signal DQSV and the data signal DQ.

Take FIG. 3 as an example, in the edges EG01~EG10 that the valid strobe pulses SV1~SV5 have, the edges EG02~EG09 correspond to data signal DQ, and the edges EG01 and EG10 do not correspond to the data signal DQ. The edges EG01 and EG10 are marked by X symbols in FIG. 3.

As a result, the sampling results generated according to the edges EG02~EG09 of the sampling clock signals CLK1~CLK4 correspond to the data signal DQ and are set as the valid sampling results SRV by the control circuit 230. The sampling results generated according to the edges EG01 and EG10 of the sampling clock signals CLK1~CLK4 do not correspond to the data signal DQ and are set as the invalid sampling results SRI by the control circuit 230.

The control circuit 230 outputs a plurality of pieces of valid data based on the valid sampling results SRV as the read data signal RDQ to the memory access controller 110. The control circuit 230 further abandons a plurality of pieces of invalid data generated according to the invalid sampling results SRI. The amount of the invalid data abandoned by the control circuit 230 is 2A. Since A is 1 in the embodiment of FIG. 3, the amount of the invalid data abandoned by the control circuit 230 is 2.

Figure 4:
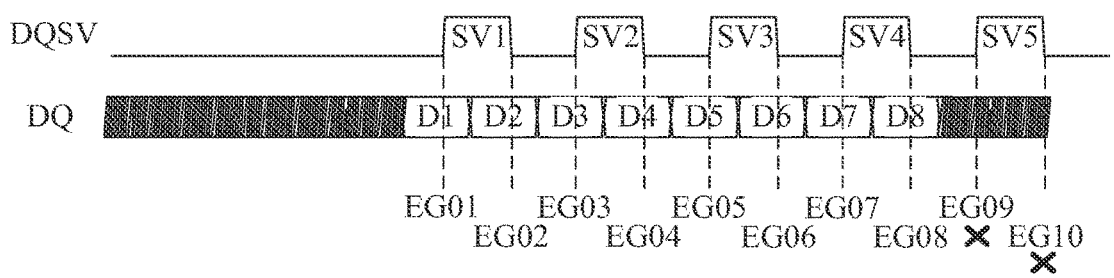
FIG. 4 illustrates a timing diagram of the signals related to the read operation of the memory access interface device according to another embodiment of the present invention.

Reference is now made to FIG. 4. FIG. 4 illustrates a timing diagram of the signals related to the read operation of the memory access interface device 120 according to another embodiment of the present invention. In FIG. 4, only the data signal DQ and the valid data strobe signal DQSV are illustrated.

Similar to FIG. 3, the data signal DQ in FIG. 4 has 8 pieces of data D1~D8 (M is 4). The data strobe signal DQS also has 5 strobe pulses SB1-SB5, and the timing thereof is ahead of the data signal DQ. However, relative to FIG. 3, the timing of the valid data strobe signal DQSV in FIG. 4 is even behind the data signal DQ due to the even later timing of the data strobe signal DQS or the longer processing time of the sampling clock generation circuit 210.

As a result, in the edges EG01~EG10 of the valid strobe pulses SV1~SV5, the edges EG01~EG08 correspond to the data signal DQ and the edges EG09 and EG10 do not correspond to the data signal DQ. The edges EG09 and EG10 are marked by X symbols in FIG. 4.

As a result, the sampling results generated according to the edges EG01~EG08 of the sampling clock signals CLK1~CLK4 correspond to the data signal DQ and are set as the valid sampling results SRV by the control circuit 230. The sampling results generated according to the edges EG09 and EG10 of the sampling clock signals CLK1~CLK4 do not correspond to the data signal DQ and are set as the invalid sampling results SRI by the control circuit 230.

The control circuit 230 outputs a plurality of pieces of valid data based on the valid sampling results SRV as the read data signal RDQ to the memory access controller 110. The control circuit 230 further abandons a plurality of pieces of invalid data generated according to the invalid sampling results SRI. The amount of the invalid data abandoned by the control circuit 230 is 2A. Since A is also 1 in the embodiment of FIG. 4, the amount of the invalid data abandoned by the control circuit 230 is 2.

Figure 5:
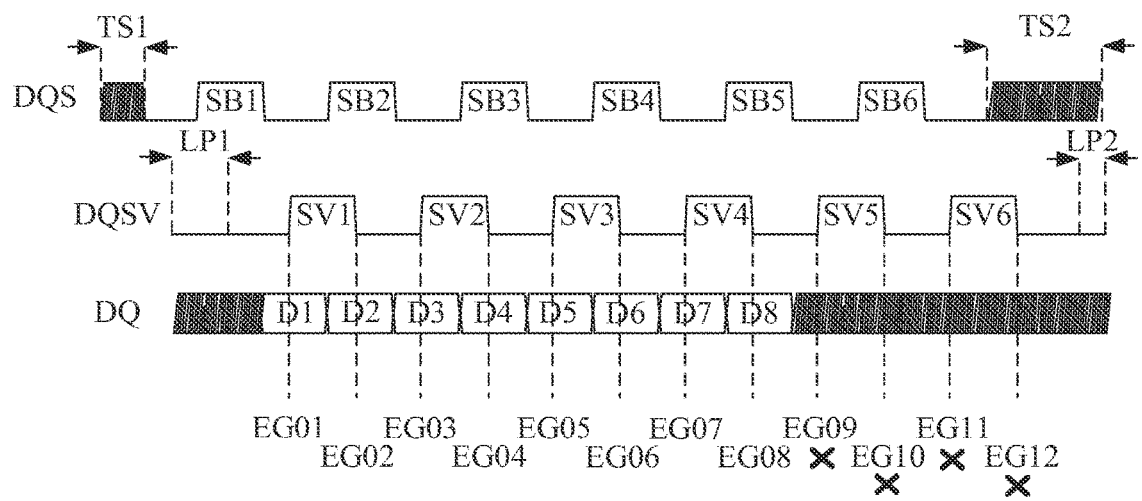
FIG. 5 illustrates a timing diagram of the signals related to the read operation of the memory access interface device according to yet another embodiment of the present invention.

Reference is now made to FIG. 5. FIG. 5 illustrates a timing diagram of the signals related to the read operation of the memory access interface device 120 according to yet another embodiment of the present invention. In FIG. 5, only the data signal DQ, the data strobe signal DQS and the valid data strobe signal DQSV are illustrated.

In an embodiment, the memory device 130 is a LPDDR5 memory device or a DDR5 memory device that supports the additional strobe function. Since the LPDDR5 memory device or the DDR5 memory device has an even higher speed such that the clock period is even shorter (even higher frequency), the timing of the sampling clock signals is much more behind the timing of the data signal DQ.

As a result, though similar to FIG. 3, in which the data signal DQ in FIG. 5 includes 8 pieces of data D1~D8 (M is 4), the data strobe signal DQS has 6 strobe pulses SB1~SB6 (P is 6 and A is 2) and the timing thereof is before the data signal DQ. The sampling clock generation circuit 210 performs the same processing on the data strobe signal DQS to generate the valid data strobe signal DQSV having the valid strobe pulses SV1~SV6, in which the valid strobe pulses SV1~SV6 has edges EG01~EG12. The edges EG01~EG08 correspond to the data signal DQ and the edges EG09~EG12 do not correspond to the data signal DQ. The edges EG09~EG12 are marked by X symbols in FIG. 5.

As a result, the sampling results generated according to the edges EG01~EG08 of the sampling clock signals CLK1~CLK4 correspond to the data signal DQ and are set as the valid sampling results SRV by the control circuit 230. The sampling results generated according to the edges EG09~EG12 of the sampling clock signals CLK1~CLK4 do not correspond to the data signal DQ and are set as the invalid sampling results SRI by the control circuit 230.

The control circuit 230 outputs a plurality of pieces of valid data based on the valid sampling results SRV as the read data signal RDQ to the memory access controller 110. The control circuit 230 further abandons a plurality of pieces of invalid data generated according to the invalid sampling results SRI. The amount of the invalid data abandoned by the control circuit 230 is 2A. Since A is 2 in the embodiment of FIG. 5, the amount of the invalid data abandoned by the control circuit 230 is 4.

Figure 6:
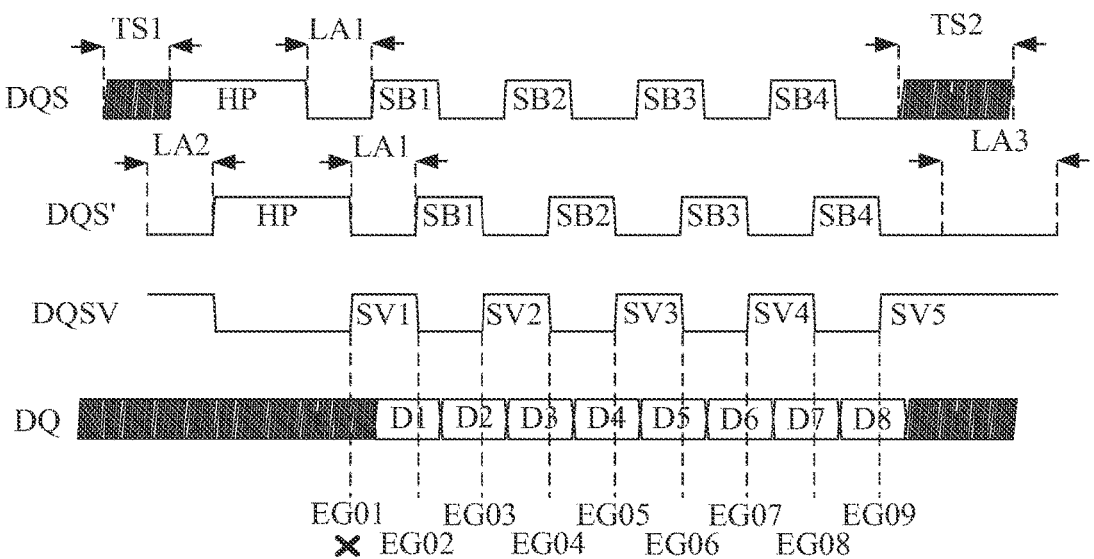
FIG. 6 illustrates a timing diagram of the signals related to the read operation of the memory access interface device according to still another embodiment of the present invention.

Reference is now made to FIG. 6. FIG. 6 illustrates a timing diagram of the signals related to the read operation of the memory access interface device 120 according to still another embodiment of the present invention.

In an embodiment, the memory device 130 is a DDR4 memory device that does not support the additional strobe function.

Similar to FIG. 3, the data signal DQ in FIG. 6 has 8 pieces of data D1~D8 (M is 4). Under such a condition, the strobe pulses amount of the strobe pulses included by the data strobe signal DQS that the sampling clock generation circuit 210 receives is M. As a result, the data strobe signal DQS has the strobe pulses SB1~SB4. The data strobe signal DQS further in turn has a tri-state preamble section TS1, a high state preamble section HP and a first low state preamble section LA1 corresponding to a half period ahead of the strobe pulses SB1~SB4, and has a tri-state postamble section TS2 behind the strobe pulses SB1~SB4.

The sampling clock generation circuit 210 eliminates the tri-state preamble section TS1 to generate the second low state preamble section LA2, and eliminates the tri-state postamble section TS2 to generate the low state postamble section LA3, so as to generate the data strobe signal DQS' illustrated in FIG. 6. The sampling clock generation circuit 210 further inverts the data strobe signal DQS' to generate the valid data strobe signal DQSV having a plurality of valid strobe pulses. Under such a condition, the valid strobe pulses amount is P, P being equal to M+0.5.

As illustrated in FIG. 6, in the present embodiment, besides 4 valid strobe pulses SV1~5V4, the valid data strobe signal DQSV further includes 0.5 strobe pulse SV5 corresponding to a high state (P is 4.5). The valid strobe pulses SV1~SV5 have edges EG01~EG9. The edges EG02~EG09 correspond to the data signal DQ. The edge EG01 does not correspond to the data signal DQ. The edges EG01 is marked by X symbols in FIG. 6.

As a result, the sampling results generated according to the edges EG02~EG09 of the sampling clock signals CLK1~CLK4 correspond to the data signal DQ and are set as the valid sampling results SRV by the control circuit 230. The sampling result generated according to the edge EG01 of the sampling clock signals CLK1~CLK4 does not correspond to the data signal DQ and is set as the invalid sampling result SRI by the control circuit 230.

The control circuit 230 outputs a plurality of pieces of valid data based on the valid sampling results SRV as the read data signal RDQ to the memory access controller 110. The control circuit 230 further abandons a plurality of pieces of invalid data generated according to the invalid sampling results SRI. The amount of the invalid data abandoned by the control circuit 230 is 1.

It is appreciated that in the embodiment of FIG. 6, the valid data strobe signal DQSV is generated by the inversion of the data strobe signal DQS'. In an initial operation stage of the memory access interface device 120, the data strobe signal DQS' supposed to be kept at the low state becomes the valid data strobe signal DQSV having the high state due to the inversion. If the sampling circuit 220 of the memory access interface device 120 receives such a high state in the initial operation stage, the sampling circuit 220 may perform false sampling. As a result, the sampling circuit 220 is configured to not perform sampling according to the sampling clock signals during the initial operation stage and start to perform sampling according to the sampling clock signals after the initial operation stage.

In an embodiment, the sampling clock generation circuit 210 generates the sampling clock signals CLK having the amount of 2N, N being larger than 1, such that the sampling results generated by the sampling circuit 220 not only includes data but also includes edge information. As a result, besides the valid data and the invalid data, the control circuit 230 also generates a plurality of pieces of valid edge information and a plurality of pieces of invalid edge information according to the valid sampling results SRV and the invalid sampling results SRI. The control circuit 230 further outputs the valid data and the valid edge information to the data processing circuit 200 and the sampling clock generation circuit 210, to serve as the feedback information mentioned above. The data processing circuit 200 and the sampling clock generation circuit fine tune the data signal DQ and the sampling clock signals CLK accordingly.

It is appreciated that the embodiments described above are merely an example. In other embodiments, it should be appreciated that many modifications and changes may be made by those of ordinary skill in the art without departing, from the spirit of the invention.

In summary, the memory system and the memory access interface device thereof of the present invention increases a sampling range by setting the valid strobe pulses amount of the valid data strobe signal larger than the data amount of the data signal, so as to avoid the false memory read result generated due to the time difference between the data signal and the data strobe signal.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory access interface device, comprising:
    a data processing circuit configured to receive and process a data signal comprising a plurality of pieces of data from a memory device, wherein a data amount of the data is 2M, M being a positive integer;
    a sampling clock generation circuit configured to receive and process a data strobe signal from the memory device to generate a valid data strobe signal having a plurality of valid strobe pulses and further generate a plurality of sampling clock signals having an amount of 2N, wherein a valid strobe pulses amount of the valid strobe pulses is P, P being larger than M and each of N and P being a positive integer;
    a sampling circuit configured to sample the data signal according to the sampling clock signals to generate a plurality of sampling results; and
    a control circuit configured to:
        set a first part of the sampling results corresponding to the data signal as a plurality of valid sampling results according to a time difference between the valid data strobe signal and the data signal; and
        output a plurality of pieces of valid data generated based on the valid sampling results as a read data signal to a memory access controller.

2. The memory access interface device of claim 1, wherein when the memory device supports an additional strobe function, the data strobe signal has a plurality of strobe pulses, has a tri-state preamble section ahead the strobe pulses, and has a tri-state postamble section behind the strobe pulses;
   the sampling clock generation circuit respectively eliminates the tri-state preamble section and the tri-state postamble section to generate a low state preamble section and a low state postamble section to generate the valid data strobe signal;
   wherein a strobe pulses amount of the strobe pulses is P and a timing of the strobe pulses is ahead of the data, P being equal to M+A and A being a positive integer larger than or equal to 1.

3. The memory access interface device of claim 2, wherein the control circuit is further configured to set a second part of the sampling results not corresponding to the data signal as a plurality of invalid sampling results and abandon a plurality of pieces of invalid data generated according to the invalid sampling results.

4. The memory access interface device of claim 2, wherein an amount of the invalid data is 2A.

5. The memory access interface device of claim 2, wherein the memory device is a LPDDR4 memory device, a LPDDR5 memory device or a DDR5 memory device.

6. The memory access interface device of claim 1, wherein when the memory device does not support the additional strobe function, the data strobe signal has a plurality of strobe pulses, in turn has a tri-state preamble section, a high state preamble section and a first low state preamble section corresponding to a half period ahead of the strobe pulses, and has a tri-state postamble section behind the strobe pulses;
   the sampling clock generation circuit eliminates the tri-state preamble section to generate a second low state preamble section, eliminates the tri-state postamble section to generate a low state postamble section and inverts the data strobe signal to generate the valid data strobe signal;
   wherein a strobe pulses amount of the strobe pulses is M, P being equal to M+0.5.

7. The memory access interface device of claim 6, wherein the sampling circuit does not perform sampling according to the sampling clock signals during an initial operation stage of the memory access interface device and starts to perform sampling according to the sampling clock signals after the initial operation stage.

8. The memory access interface device of claim 6, wherein an amount of the invalid data is 1.

9. The memory access interface device of claim 6, wherein the memory device is a DDR4 memory device.

10. The memory access interface device of claim 1, wherein N is a positive integer larger than 1, and the control circuit further generates a plurality of pieces of valid edge information according to the valid sampling results, and outputs the valid sampling results having the valid data and the valid edge information to the data processing circuit and the sampling clock generation circuit, such that the data processing circuit and the sampling clock generation circuit fine tune the data signal and the sampling clock signals accordingly.

11. A memory system, comprising:
   a memory access controller;
   a memory device; and
   a memory access interface device, comprising:
      a data processing circuit configured to receive and process a data signal comprising a plurality of pieces of data from the memory device, wherein a data amount of the data is 2M, M being a positive integer;
      a sampling clock generation circuit configured to receive and process a data strobe signal from the memory device to generate a valid data strobe signal having a plurality of valid strobe pulses and further generate a plurality of sampling clock signals having an amount of 2N, wherein a valid strobe pulses amount of the valid strobe pulses is P, P being larger than M and each of N and P being a positive integer;
      a sampling circuit configured to sample the data signal according to the sampling clock signals to generate a plurality of sampling results; and
      a control circuit configured to:
         set a first part of the sampling results corresponding to the data signal as a plurality of valid sampling results according to a time difference between the valid data strobe signal and the data signal; and
         output a plurality of pieces of valid data generated based on the valid sampling results as a read data signal to the memory access controller.

12. The memory system of claim 11, wherein when the memory device supports an additional strobe function, the data strobe signal has a plurality of strobe pulses, has a tri-state preamble section ahead the strobe pulses, and has a tri-state postamble section behind the strobe pulses;
   the sampling clock generation circuit respectively eliminates the tri-state preamble section and the tri-state postamble section to generate a low state preamble section and a low state postamble section to generate the valid data strobe signal;
   wherein a strobe pulses amount of the strobe pulses is P and a timing of the strobe pulses is ahead of the data, P being equal to M+A and A being a positive integer larger than or equal to 1.

13. The memory system of claim 12, wherein the control circuit is further configured to set a second part of the sampling results not corresponding to the data signal as a plurality of invalid sampling results and abandon a plurality of pieces of invalid data generated according to the invalid sampling results.

14. The memory system of claim 12, wherein an amount of the invalid data is 2A.

15. The memory system of claim 12, wherein the memory device is a LPDDR4 memory device, a LPDDR5 memory device or a DDR5 memory device.

16. The memory system of claim 11, wherein when the memory device does not support the additional strobe function, the data strobe signal has a plurality of strobe pulses, in turn has a tri-state preamble section, a high state preamble section and a first low state preamble section corresponding to a half period ahead of the strobe pulses, and has a tri-state postamble section behind the strobe pulses;
   the sampling clock generation circuit eliminates the tri-state preamble section to generate a second low state preamble section, eliminates the tri-state postamble section to generate a low state postamble section and inverts the data strobe signal to generate the valid data strobe signal;
   wherein a strobe pulses amount of the strobe pulses is M, P being equal to M+0.5.

17. The memory system of claim 16, wherein the sampling circuit does not perform sampling according to the sampling clock signals during an initial operation stage of the memory system and starts to perform sampling according to the sampling clock signals after the initial operation stage.

18. The memory system of claim 16, wherein an amount of the invalid data is 1.

19. The memory system of claim 16, wherein the memory device is a DDR4 memory device.

20. The memory system of claim 11, wherein N is a positive integer larger than 1, and the control circuit further generates a plurality of pieces of valid edge information according to the valid sampling results, and outputs the valid sampling results having the valid data and the valid edge information to the data processing circuit and the sampling clock generation circuit, such that the data processing circuit and the sampling clock generation circuit fine tune the data signal and the sampling clock signals accordingly.

* * * * *